(12) United States Patent
Grzesik

(10) Patent No.: US 10,381,502 B2
(45) Date of Patent: Aug. 13, 2019

(54) MULTICOLOR IMAGING DEVICE USING AVALANCHE PHOTODIODE

(71) Applicant: Teledyne Scientific & Imaging, LLC, Thousand Oaks, CA (US)

(72) Inventor: Michael Grzesik, Thousand Oaks, CA (US)

(73) Assignee: TELEDYNE SCIENTIFIC & IMAGING, LLC, Thousand Oaks, CA (US)

(*) Notice: Subject to any disclaimer, the term of this patent is extended or adjusted under 35 U.S.C. 154(b) by 0 days.

(21) Appl. No.: 15/080,041

(22) Filed: Mar. 24, 2016

(65) Prior Publication Data

US 2017/0069780 A1    Mar. 9, 2017

Related U.S. Application Data

(60) Provisional application No. 62/215,872, filed on Sep. 9, 2015.

(51) Int. Cl.
| | |
|---|---|
| H04N 5/378 | (2011.01) |
| H01L 27/146 | (2006.01) |
| H01L 31/105 | (2006.01) |
| H01L 31/107 | (2006.01) |
| H01L 31/0296 | (2006.01) |
| H01L 31/0304 | (2006.01) |

(52) U.S. Cl.
CPC .... *H01L 31/1075* (2013.01); *H01L 27/14645* (2013.01); *H01L 31/02966* (2013.01); *H01L 31/0304* (2013.01); *H01L 31/03046* (2013.01); *H01L 31/105* (2013.01); *H04N 5/378* (2013.01)

(58) Field of Classification Search
CPC ......... H01L 31/1075; H01L 27/14645; H01L 31/107; H01L 31/03042
USPC ........................................ 257/438, 186, 437
See application file for complete search history.

(56) References Cited

U.S. PATENT DOCUMENTS

| | | | |
|---|---|---|---|
| 3,821,777 A * | 6/1974 | James ................... | H01L 31/107 |
| | | | 148/DIG. 107 |
| 4,258,375 A * | 3/1981 | Hsieh .................... | H01L 31/107 |
| | | | 257/186 |
| 4,316,206 A | 2/1982 | Bottka et al. ................... | 357/30 |

(Continued)

OTHER PUBLICATIONS

McClish et al. "A Reexamination of Silicon Avalance Photodiode Gain and Quantum Efficiency", UEEE (2005).

*Primary Examiner* — Lex H Malsawma
*Assistant Examiner* — Eric W Jones
(74) *Attorney, Agent, or Firm* — M.J. Ram & Associates

(57) ABSTRACT

A multicolor imaging device capable of imaging two or more wavelengths with a single pixel comprises an avalanche photodiode having a material composition such that only one carrier causes substantially all of the impact ionization that occurs within the photodiode. The photodiode is arranged such that, when reverse-biased, the photodiode's gain varies with the photon energy of incident light. The photodiode, preferably a PIN avalanche photodiode or a separate absorber-multiplier photodiode, produces an output signal which can include at least two components produced in response to two different wavelengths of incident light. Circuitry receiving the output signal would typically include a means of extracting each of the components from the output signal.

11 Claims, 2 Drawing Sheets

(56) References Cited

U.S. PATENT DOCUMENTS

| | | | | |
|---|---|---|---|---|
| 4,476,477 A * | 10/1984 | Capasso | H01L 31/109 | 257/185 |
| 4,486,765 A * | 12/1984 | Capasso | H01L 31/035281 | 257/184 |
| 4,518,255 A * | 5/1985 | Zuleeg | G01S 17/105 | 250/552 |
| 4,568,959 A * | 2/1986 | Chang | H01L 31/109 | 257/185 |
| 4,731,641 A * | 3/1988 | Matsushima | H01L 31/18 | 257/189 |
| 4,862,236 A * | 8/1989 | Shin | H01L 21/02411 | 257/188 |
| 4,893,353 A * | 1/1990 | Iwaoka | G02F 1/11 | 398/183 |
| 4,935,795 A * | 6/1990 | Mikawa | H01L 31/1075 | 257/437 |
| 4,956,686 A | 9/1990 | Borrello et al. | | 357/30 |
| 4,984,032 A * | 1/1991 | Miura | H01L 31/03042 | 257/186 |
| 5,075,750 A * | 12/1991 | Kagawa | B82Y 20/00 | 257/189 |
| 5,149,956 A | 9/1992 | Norton | | 250/211 |
| 5,313,073 A * | 5/1994 | Kuroda | H01L 31/035236 | 257/18 |
| 5,329,136 A * | 7/1994 | Goossen | B82Y 20/00 | 257/17 |
| 5,338,947 A * | 8/1994 | Watanabe | B82Y 20/00 | 257/15 |
| 5,384,469 A | 1/1995 | Choi | | 257/21 |
| 5,539,221 A * | 7/1996 | Tsuji | H01L 31/1075 | 257/13 |
| 5,572,043 A * | 11/1996 | Shimizu | B82Y 20/00 | 257/15 |
| 5,818,051 A * | 10/1998 | Dreiske | H01L 27/14652 | 250/370.06 |
| 6,323,941 B1 * | 11/2001 | Evans | G01S 17/023 | 250/339.02 |
| 6,350,998 B1 * | 2/2002 | Tsuji | H01L 31/03046 | 257/185 |
| 6,756,613 B2 * | 6/2004 | Yuan | H01L 31/105 | 257/184 |
| 6,803,557 B1 * | 10/2004 | Taylor | H01L 27/14618 | 250/208.1 |
| 7,432,537 B1 | 10/2008 | Huntington | | 257/186 |
| 7,459,730 B1 * | 12/2008 | Kinch | H01L 31/109 | 257/188 |
| 7,608,823 B2 | 10/2009 | Tennant | | 250/338 |
| 7,608,830 B1 | 10/2009 | Kinch | | 250/370 |
| 7,714,368 B2 | 5/2010 | Yang et al. | | 257/291 |
| 8,610,808 B2 | 12/2013 | Prescher et al. | | 348/276 |
| 8,766,808 B2 | 7/2014 | Hogasten | | 340/632 |
| 8,772,729 B1 * | 7/2014 | Brown | B82Y 30/00 | 250/370.07 |
| 8,836,066 B1 | 9/2014 | Brown et al. | | 257/438 |
| 9,035,410 B2 | 5/2015 | Yuan et al. | | |
| 9,184,202 B2 | 11/2015 | Dutta | | |
| 9,406,831 B2 * | 8/2016 | Rothman | H01L 31/1075 | |
| 9,847,441 B2 * | 12/2017 | Huntington | H01L 31/1075 | |
| 2002/0117697 A1 * | 8/2002 | Tanaka | H01L 31/02161 | 257/288 |
| 2003/0047752 A1 * | 3/2003 | Campbell | H01L 31/107 | 257/186 |
| 2003/0111675 A1 * | 6/2003 | Yao | H01L 31/105 | 257/233 |
| 2003/0160157 A1 | 8/2003 | Baharav et al. | | 250/226 |
| 2004/0038472 A1 * | 2/2004 | Ando | B82Y 20/00 | 438/200 |
| 2005/0017317 A1 * | 1/2005 | Yao | H01L 31/03046 | 257/439 |
| 2005/0077539 A1 * | 4/2005 | Lipson | B82Y 10/00 | 257/186 |
| 2006/0175529 A1 * | 8/2006 | Harmon | B82Y 20/00 | 250/207 |
| 2007/0029485 A1 * | 2/2007 | Beck | H01L 31/02027 | 250/338.4 |
| 2007/0267653 A1 * | 11/2007 | Yoneda | H01L 31/0304 | 257/186 |
| 2008/0111152 A1 * | 5/2008 | Scott | H01L 27/14603 | 257/188 |
| 2010/0051809 A1 * | 3/2010 | Onat | B82Y 20/00 | 250/332 |
| 2011/0018086 A1 * | 1/2011 | Linga | H01L 31/1075 | 257/438 |
| 2011/0031401 A1 * | 2/2011 | Mitra | H01L 31/02966 | 250/338.4 |
| 2011/0127415 A1 * | 6/2011 | Kanter | G01J 1/44 | 250/252.1 |
| 2011/0169117 A1 * | 7/2011 | McIntosh | H01L 27/1446 | 257/432 |
| 2013/0221193 A1 * | 8/2013 | Williams | H01L 31/107 | 250/206 |
| 2014/0183683 A1 * | 7/2014 | Rothman | H01L 31/107 | 257/438 |
| 2014/0264270 A1 * | 9/2014 | Dutta | H01L 27/14636 | 257/14 |
| 2015/0076647 A1 * | 3/2015 | Tatum | H01L 31/107 | 257/438 |
| 2015/0129747 A1 | 5/2015 | Petilli | | |
| 2015/0179863 A1 * | 6/2015 | Huffaker | H01L 31/115 | 257/186 |
| 2016/0005887 A1 * | 1/2016 | Lo | H01L 31/068 | 136/256 |
| 2016/0091617 A1 * | 3/2016 | Bouzid | H04L 9/00 | 250/371 |
| 2017/0012162 A1 * | 1/2017 | Ghosh | H01L 31/1075 | |
| 2017/0033253 A1 * | 2/2017 | Huntington | H01L 31/1075 | |
| 2017/0040368 A1 * | 2/2017 | Grzesik | H01L 27/14623 | |

* cited by examiner

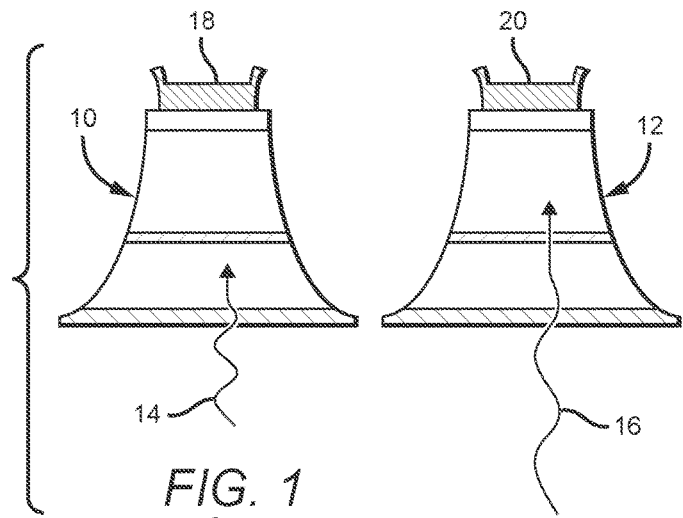
FIG. 1
PRIOR ART
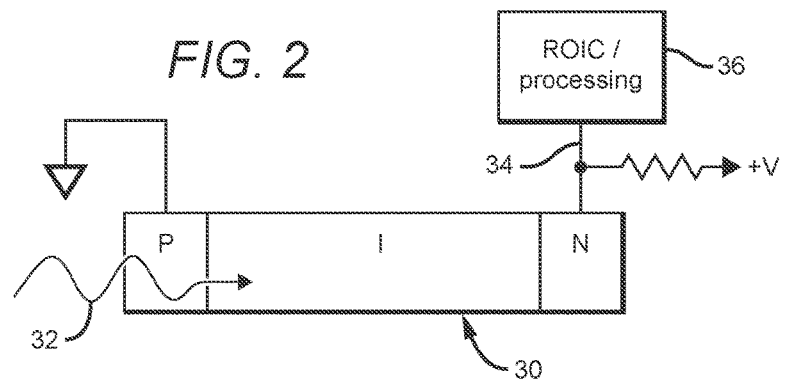
FIG. 2
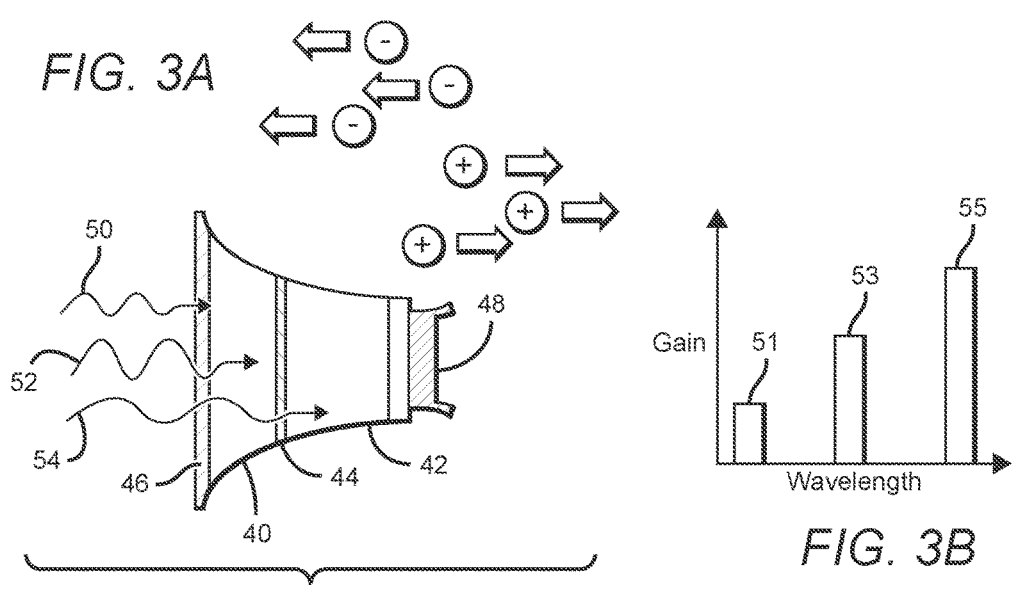
FIG. 3A
FIG. 3B

MULTICOLOR IMAGING DEVICE USING AVALANCHE PHOTODIODE

RELATED APPLICATIONS

This application claims the benefit of provisional patent application No. 62/215,872 to Michael Grzesik, filed Sep. 9, 2015.

BACKGROUND OF THE INVENTION

Field of the Invention

This invention relates generally to imaging devices, and more particularly to an avalanche photodiode-based imaging device capable of imaging in at least two distinct wavebands.

Description of the Related Art

Imaging in two distinct wavebands (e.g., midwave-longwave or visible-midwave) typically requires multiple focal plane arrays. The most advanced focal plane arrays can image two wavebands separately, but typically can only measure one waveband at a time and must dither between the two wavebands to produce a two color image.

In other instances, simultaneous two color imaging is possible. However, this requires complex fabrication techniques as well as the need for pixels sensitive to different colors to have their own separate electrical connections to the readout integrated circuit (ROIC). This is illustrated in FIG. 1. Two p-n junction devices 10 and 12 are designed to image two different wavebands. For example, device 10 may be arranged to image incoming light with wavelengths 14 in the blue or UV portions of the spectrum, and device 12 may be arranged to image incoming light with wavelengths 16 in the red or IR portions of the spectrum. Each device would typically require an indium bump 18, 20 to facilitate connection to an ROIC. This requirement for a separate electrical connection to the ROIC for different colors comes at the expense of decreased focal plane array format size or an increase in system size, weight and power (SWaP). In addition, to be sensitive to different wavelengths, each photodiode may need to be based on different materials and require different fabrication steps.

SUMMARY OF THE INVENTION

A multicolor imaging device is presented which is capable of imaging two or more wavebands with a single pixel.

The present imaging device requires an avalanche photodiode having a material composition such that only one carrier causes substantially all of the impact ionization that occurs within the photodiode. The photodiode must also be arranged such that, when reverse-biased, the photodiode's gain varies with the photon energy of incident light. The photodiode produces an output signal, and the imaging device includes circuitry arranged to receive the output signal.

The photodiode is preferably a PIN avalanche photodiode or a separate absorber-multiplier avalanche photodiode. When arranged and operated as described above, the photodiode's output signal can include at least two components produced in response to two different wavelengths of incident light. The circuitry, preferably a readout integrated circuit (ROIC), would typically include a means of extracting each of the components from the output signal.

These and other features, aspects, and advantages of the present invention will become better understood with reference to the following drawings, description, and claims.

BRIEF DESCRIPTION OF THE DRAWINGS

FIG. 1 is a sectional view illustrating the operation of a known photodiode.

FIG. 2 is a sectional view illustrating the operation of a PIN photodiode in accordance with the present invention.

FIG. 3A is a sectional view illustrating the operation of a separate absorber-multiplier avalanche photodiode in accordance with the present invention.

FIG. 3B is a graph depicting gain values provided by the photodiode of FIG. 3A for different colors of incident light.

DETAILED DESCRIPTION OF THE INVENTION

Figure 4A:
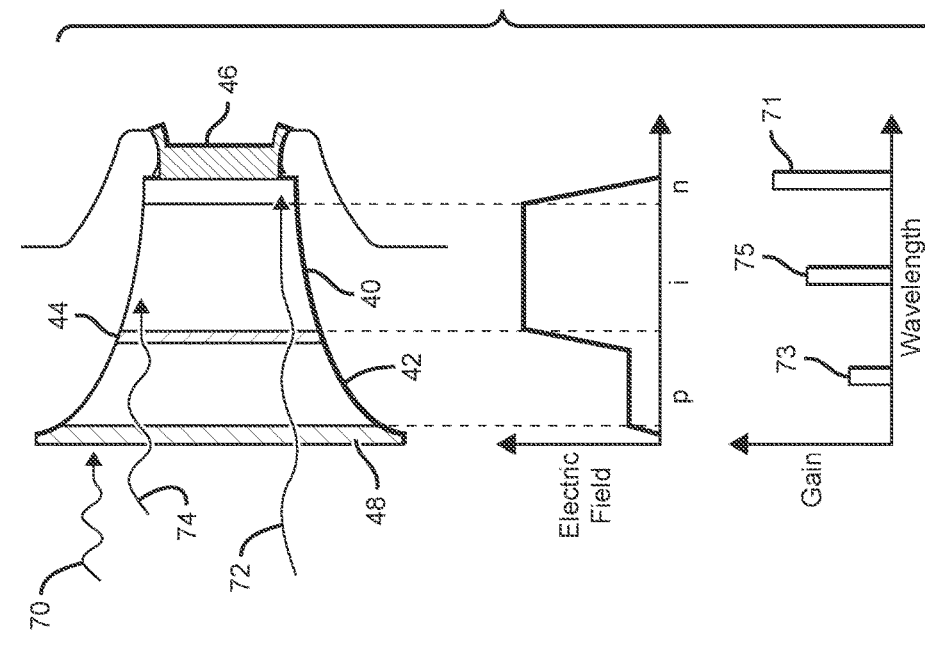
FIG. 4A is a diagram depicting a separate absorber-multiplier avalanche photodiode per the present invention, the photodiode's electric field, and the resulting gain values provided by the photodiode for different colors of incident light.

The present imaging device allows for two or more colors to be imaged in a single pixel with only one electrical connection between pixel and readout circuit. The device uses the unique properties of a certain class of semiconductors to image multiple colors in a single pixel.

In semiconductors where only one carrier, either electrons or holes, causes substantially all of the impact ionization, the photon energy of incident light can be determined from the amount of electrical gain the device produces. Specifically, using an avalanche photodiode having a material composition such that the difference between the electron and hole impact ionization coefficients is very large, differences in photon energy result in different amounts of gain. Photon energy varies with wavelength. Thus, when the photodiode is reverse-biased, its gain varies with the photon energy—and therefore the wavelength—of incident light. When so arranged, the photodiode's resulting output signal can contain multiple components, each of which arises in response to a different wavelength of incident light. Circuitry provided to receive the output signal is preferably arranged to extract each of the components, thereby providing multicolor imaging in a single pixel.

In a preferred embodiment, the photodiode is a separate absorber-multiplier avalanche photodiode in which the absorber would inject high gain carriers (low photon energy), while the multiplier could detect medium and low gain higher energy photons. Examples of material systems for which the difference between the electron and hole impact ionization coefficients is very large include HgCdTe and InAs. Other material systems may also work.

The photodiode is preferably a PIN avalanche photodiode or a separate absorber-multiplier avalanche photodiode. FIG. 2 depicts an imaging device comprising a PIN avalanche photodiode 30. The photodiode has a material composition such that only one carrier causes substantially all of the impact ionization that occurs within the photodiode, and such that, when reverse-biased, the gain of the photodiode varies with the photon energy of incident light 32. The gain varies because charge multiplication depends on where in the device the electron-hole pairs are created, which is wavelength dependent. As light with different wavelengths has different photon energies, different wavelengths will result in different gain components. The photodiode 30, when reversed-biased as shown in FIG. 2, produces an output signal 34 which includes components that vary with the photodiode's gain. Output signal 34 is received by circuitry 36, which typically includes a ROIC and is arranged to process the output signal to determine the magnitudes of the wavelength components present in incident light 32.

The material composition of the photodiode may comprise, for example, InAs or HgCdTe, such that the carrier which causes substantially all of the impact ionization that occurs within the photodiode is electrons. Thus, for a material composition of, for example, $Hg_{0.7}Cd_{0.3}Te$, avalanche multiplication is initiated only by electrons. As a result, the amount of gain produced in an avalanche photodiode with this composition will depend on where in the high field region of the device an electron-hole pair is created. Similarly, the material composition of the photodiode may also comprise, for example, GaAlSb, such that substantially all of the impact ionization that occurs within the photodiode is holes.

As noted above, a single output signal is produced by the single pixel, with the signal containing components from multiple colors of incident light (assuming the incident light is made up of different wavelengths). As noted above, the circuitry 36 to which the photodiode is coupled typically includes a ROIC. To separate out information about the different wavelengths and thereby provide multicolor imaging requires a means of extracting each component from the output signal, typically requiring some type of processing circuitry. The means by which individual wavelengths are parsed from the output signal may vary from one application to the next. It is possible that some mathematical manipulation (e.g. Fourier transform) will be required.

The present imaging device might also employ an avalanche photodiode having separate absorber and multiplier regions. An exemplary embodiment is shown in FIG. 3A. The photodiode includes a multiplier region 40 and an absorber region 42, likely separated by a field stop layer 44. An anode contact 46 is adjacent multiplier region 40 and a cathode contact 48—typically an indium bump—is adjacent absorber region 42. A separate absorber-multiplier avalanche photodiode which functions as described above can be provided with a multiplier region that comprises, for example, $Hg_{0.7}Cd_{0.3}Te$ or InAs, and/or an absorber region which comprises, for example, HgCdTe, InGaAsP or InAs. The device has an associated operating voltage. In operation, a constant reverse bias voltage is applied across the device, which should be designed so that a small amount of electric field exists in the absorber material at the operating voltage. This results in electrons and holes moving as indicated in FIG. 3A. The device should be designed so that a higher electric field exists in the multiplier region than in the absorber region; this is controlled by appropriate doping of the various material layers. This separate absorber region could be operated in either linear- or Geiger-mode, which is required to achieve gain in the device. Note that operation of the FIG. 3A device requires circuitry (not shown) similar to that shown in FIG. 2, to provide the reverse-bias voltage and to receive and process the photodiode's output signal.

When so arranged, the gain of the separate absorber-multiplier avalanche photodiode is wavelength-dependent; gain for three different wavelengths is depicted in FIG. 3B. As an example, assume a separate absorber-multiplier avalanche photodiode in which $Hg_{0.7}Cd_{0.3}Te$ is used in multiplier region 40. In such a device, electron-hole pairs can be generated at the surface, in multiplier region 40, or in absorber region 42. The resulting gain in the device depends on where the electron-hole pairs are created, which in turn depends on the wavelength of incident radiation.

For example, for blue light having a relatively short wavelength (represented by arrow 50), electron-hole pairs are generated at the surface, resulting in a small gain (51). For green light having a wavelength of medium length (represented by arrow 52), electron-hole pairs are generated in multiplier region 40, resulting in greater gain (53). For red light, having the longest wavelength (represented by arrow 54), electron-hole pairs are generated in absorber region 42, resulting in the greatest amount of gain (55). The output signal from such a device would include at least three components, produced by the photodiode in response to three different wavelengths of incident light.

Figure 4B:
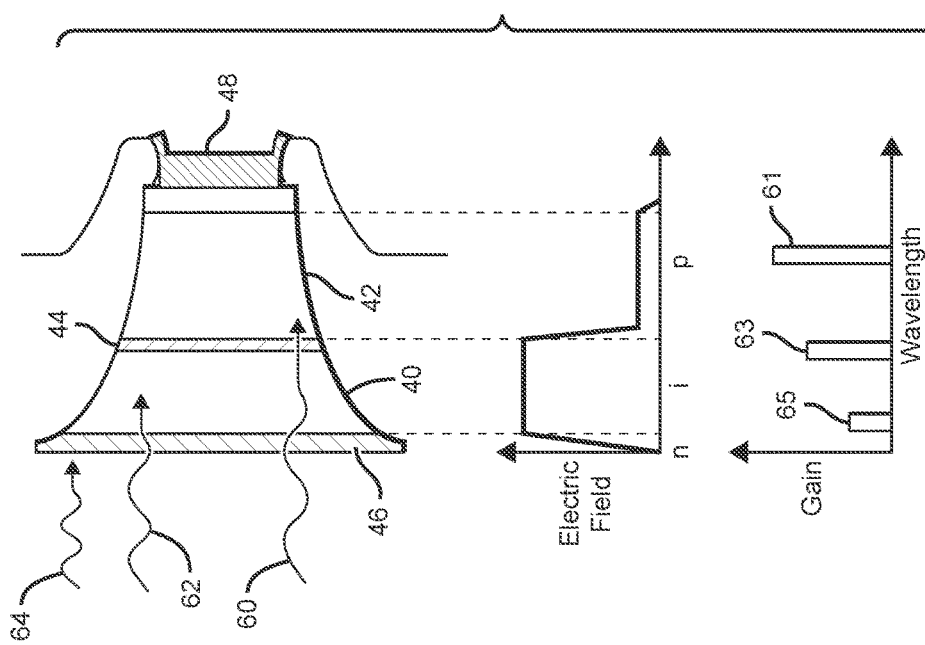
FIG. 4B is a diagram depicting a separate absorber-multiplier avalanche photodiode per the present invention having the opposite polarity to the device in FIG. 4A, the photodiode's electric field, and the resulting gain values provided by the photodiode for different colors of incident light.

This is illustrated in more detail in FIGS. 4A and 4B, each of which depicts an embodiment of the present imaging device, an electric field diagram for the device, and a graph depicting gains for different wavelengths. For the exemplary embodiment shown in FIG. 4A, the device is arranged such that incident light impinges on the surface of the photodiode adjacent multiplier region 40, and device polarity is arranged such that electrons move to the left and holes move to the right. In this example, electron-hole pairs are generated by three different wavelengths of incident radiation. The longest wavelength (60) is absorbed in absorber region 42. As a result, an electron is injected into the high field region, resulting in a large amount of gain (61) because the electron generates additional electron-hole pairs as it traverses the full distance across the high field multiplier region. Next consider medium wavelength radiation (62). Unlike the long wavelength radiation, the medium wavelength radiation is short enough to be absorbed in multiplier region 40. This results in gain (63) that is less than the long wavelength case because the electron generated in high field multiplier region 40 travels a shorter distance through the high field region. Lastly, short wavelength radiation (64) generates an electron-hole pair at the surface, injecting a hole into high field multiplier region 40. Because the hole cannot cause a significant amount of impact ionization, it results in unity gain (65) as it traverses the high field region.

FIG. 4B shows a similar device having the opposite polarity device; here, incident light impinges on the surface of the photodiode adjacent absorber region 42, and electrons move to the right and holes move to the left. In this case, the short wavelength radiation (70) results in high gain (71), the long wavelength (72) results in unity gain (73), and the medium wavelength (74) results in a gain (75) that falls between the high and unity gains.

Note that, though the exemplary embodiments described herein can image up to three colors, the described techniques could be extended to provide an imaging device capable of imaging more than three colors in a single pixel. It should also be noted that a practical imager would require an array of imaging devices as described herein.

For conventional two-color imaging devices, a primary challenge is fabricating two distinct pixels side-by-side made from different material alloys. Here, this challenge is alleviated by having multiple colors imaged in the same pixel. Note that the material doping in the absorber and multiplier regions must be carefully controlled to effectively control the electric field profile in the device. In addition, the gain properties of the different wavebands must be different from each other so that different wavebands can be simultaneously measured and analyzed by means of processing circuitry, which may be on-chip or off.

The present multicolor imaging device offers several advantages. By being able to image at several different wavelengths, array format size, weight and power (SWaP), as well as spectral crosstalk, can be greatly reduced. Also, whereas conventional single-waveband imaging devices might be incapable of performing in certain environments such as smoke, the present imaging device might be able to overcome this by enabling imaging in unaffected wavebands. Furthermore, as noted above, the present imaging device differs from conventional devices in that multiple color imaging can be made in a single pixel with only one electrical connection per pixel to the ROIC.

Though avalanche photodiodes have become ever more commonplace, advances in avalanche photodiode technology has only been incremental. Similarly, advances in two color imaging using conventional focal plane array technology has focused primarily on slight improvements in device performance. One novel aspect of the present imaging device stems from the fact that two or more separate imaging fields can be brought together, resulting in a detector more capable than the sum of its contributing parts.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A multicolor imaging device, comprising:
   a separate absorber-multiplier mesa-isolated photodiode, said photodiode having a material composition such that only one carrier causes substantially all of the impact ionization that occurs within said photodiode, said photodiode comprising:
      a multiplier region which consists of HgCdTe or InAs;
      an anode contact immediately adjacent said multiplier region;
      an absorber region distinct from said multiplier region;
      a cathode contact immediately adjacent and in contact with said absorber region; and
      a field stop layer separating said multiplier region and said absorber region;
   such that, when reverse-biased, the gain of said photodiode varies with different incident wavelengths, said photodiode producing an output signal;
   wherein said incident wavelengths impinge on a surface of said photodiode adjacent to said multiplier region and opposite said absorber region, and
   wherein said photodiode has an associated operating voltage, said photodiode arranged such that an electric field is present in said absorber region and in said multiplier region at said operating voltage, the electric field in said multiplier region being higher than that in said absorber region.

2. The imaging device of claim 1, said photodiode arranged such that longer wavelengths of incident light result in more gain than shorter wavelengths.

3. The imaging device of claim 1, wherein said imaging device is arranged such that said absorber region is operated in Geiger- or linear-mode.

4. The imaging device of claim 1, wherein said multiplier region comprises $Hg_{0.7}Cd_{0.3}Te$ or InAs.

5. The imaging device of claim 1, wherein said absorber region comprises InGaAsP or InAs or HgCdTe.

6. The imaging device of claim 1, wherein said output signal includes at least three components produced by said photodiode in response to three different wavelengths of incident light.

7. The imaging device of claim 1, further comprising circuitry arranged to receive said output signal.

8. The imaging device of claim 7, wherein said circuitry is a readout integrated circuit (ROIC).

9. The imaging device of claim 7, wherein said circuitry comprises a means of extracting each of said components from said output signal.

10. The imaging device of claim 1, wherein said incident wavelengths impinge directly on said surface of said photodiode adjacent to said multiplier region and opposite said absorber region, with no intervening materials.

11. A multicolor imaging device, comprising:
    a separate absorber-multiplier mesa-isolated photodiode, said photodiode having a material composition such that only one carrier causes substantially all of the impact ionization that occurs within said photodiode, said photodiode comprising:
       a multiplier region which comprises $Hg_{0.7}Cd_{0.3}Te$ or InAs;
       an anode contact immediately adjacent said multiplier region;
       an absorber region distinct from said multiplier region;
       a cathode contact immediately adjacent and in contact with said absorber region; and
       a field stop layer separating said multiplier region and said absorber region;
    such that, when reverse-biased, the gain of said photodiode varies with different incident wavelengths, said photodiode producing an output signal;
    wherein said incident wavelengths impinge directly on a surface of said photodiode adjacent to said absorber region and opposite said multiplier region, with no intervening materials, said photodiode arranged such that shorter wavelengths of incident light result in more gain than longer wavelengths.

* * * * *